(12) United States Patent
Hou et al.

(10) Patent No.: US 6,619,974 B1
(45) Date of Patent: Sep. 16, 2003

(54) SOCKET HAVING GUIDING MEANS

(75) Inventors: Sung-Pei Hou, Tu-Chen (TW); Hsiang-Ping Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/287,907

(22) Filed: Nov. 4, 2002

(30) Foreign Application Priority Data

Jun. 13, 2002  (TW) ........................................ 91208821 U (51) Int. Cl.[7] ........................ H01R 4/50; H01R 13/625; H01R 13/64
(52) U.S. Cl. ........................ 439/342; 439/374; 439/378
(58) Field of Search ................................ 439/342, 259, 439/265, 345, 374, 378

(56) References Cited

U.S. PATENT DOCUMENTS

| | | | | |
|---|---|---|---|---|
| 5,387,121 A | * | 2/1995 | Kurz | 439/342 |
| 5,489,218 A | * | 2/1996 | McHugh | 439/342 |
| 5,622,514 A | * | 4/1997 | Crompton et al. | 439/342 |
| 5,722,848 A | * | 3/1998 | Lai et al. | 439/342 |
| 6,280,223 B1 | | 8/2001 | Lin | |
| 6,368,139 B1 | | 4/2002 | Ohkita et al. | |
| 6,371,786 B1 | * | 4/2002 | Howell et al. | 439/342 |
| 6,435,893 B1 | * | 8/2002 | Kasahara | 439/342 |
| 6,508,659 B1 | * | 1/2003 | Howell et al. | 439/342 |

OTHER PUBLICATIONS

AMP catalog titled Socket 462 (Socket A) Assembly, Low Profile.

* cited by examiner

Primary Examiner—Chandrika Prasad
(74) Attorney, Agent, or Firm—Wei Te Chung (57) ABSTRACT

A socket includes a base (10), a number of terminals (50) received in the base, a cover (10) movably mounted upon the base, an actuator (40) sandwiched between the cover and the base for driving the cover upon the base to move, and a guiding means (50). The guiding means includes a pair of columnar guiding posts (51, 51a, 51b 51c) and a pair of guiding holes (52, 52a, 52b, 52c) for receiving corresponding guiding posts. When the cover is in an open position, the guiding post is loosely received in the guiding hole and when the cover is in a close position, the guiding post is closely received in the guiding hole.

10 Claims, 10 Drawing Sheets

SOCKET HAVING GUIDING MEANS

CROSS-REFERENCE TO RELATED APPLICATIONS

This patent application is a Co-pending Application of U.S. patent application Ser. No. 10/090,222, entitled "ELECTRICAL SOCKET HAVING A BACKUP MEANS", filed on Mar. 1, 2002, invented by David Gregory Howell and assigned to the same assignee as the present patent application.

BACKGROUND OF THE INVENTION

1. Field of the Invention

The present invention relates to a Zero Insertion Force (ZIF) socket, and particularly to a ZIF socket with a guiding means.

2. Description of Related Art

U.S. Pat. Nos. 5,722,848, 5,489,218, and 6,371,786 each disclose a conventional ZIF socket. In addition, an article entitled "Socket 462 (Socket A) Assembly, Low Profile" was announced on the web: http://www.amp.com/productnews/pdf/1308344.pdf; also discloses a conventional ZIF socket. The conventional ZIF socket typically includes a base with a plurality of terminals received therein, a cover movably mounted upon the base and an actuator. The actuator includes an operating handle and an integral cam shaft sandwiched between the base and the cover. The handle is movable to rotate the cam shaft thereby driving the cover to move horizontally upon the base. Therefore, a Central Process Unit (CPU) mounted upon the cover moves together with the cover upon the base and pins of the CPU electrically connect with corresponding terminals of the ZIF socket. In addition, since the cam shaft is below and engages with the cover on a top face thereof, the cover has a slightly upward movement when the cam shaft rotates around. Referring to FIGS. 8 and 8A of U.S. Pat. No. 5,722,848, the cover forms a retention device (54) engaging with a restriction plane (64) of the base in order to prevent the cover from releasing from the base. However, since the moving distance of the cover correlates with the diameter of the cam shaft, the socket only provides small moving distance of the cover for little diameter of the cam shaft. If the moving distance of the cover must be increased, such must increase the diameter of the cam shaft and enlarge the upward movement of the cover which troubles the engagement between the retention device of the cover and restriction plane of the base, and affects the electrical connection between the pins of the CPU and the terminals of the socket.

Figure 11:
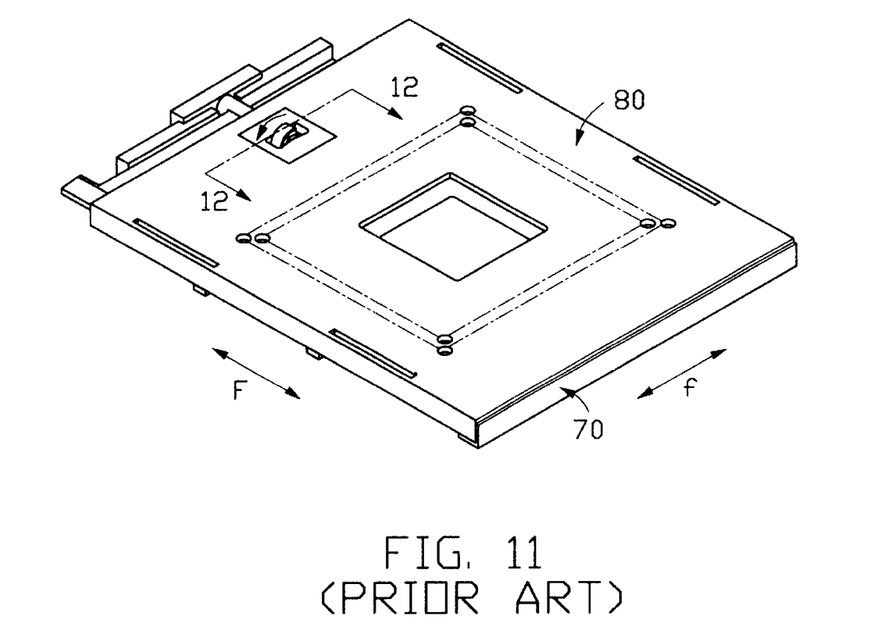
FIG. 11 is an assembled, perspective view of a conventional CPU socket.
Figure 12:
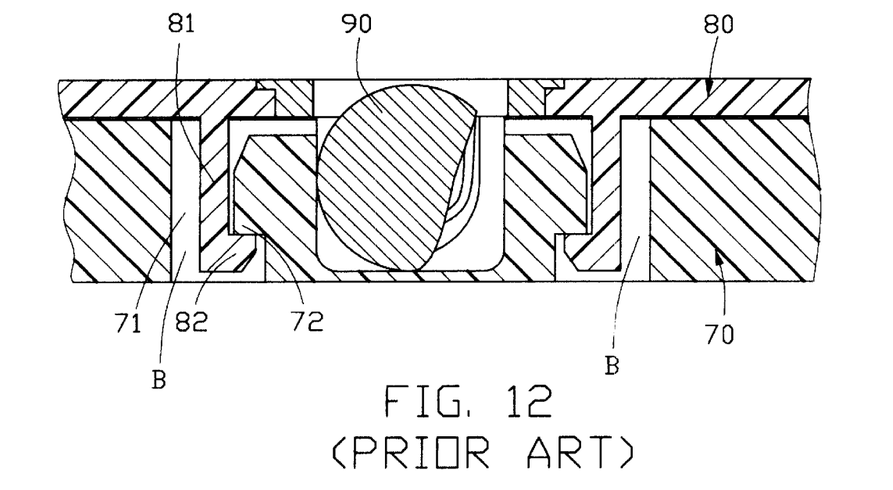
FIG. 12 is a partial, cross-sectional view of the CPU socket taken along line 12—12 of FIG 11.

Referring to FIGS. 11 and 12, U.S. Pat. No. 6,280,223 discloses a conventional socket 6. Similarly, the socket 6 includes a base 70, a plurality of terminals (not shown) received in the base 70, a cover 80 mounted upon the base 70 and an actuator 90 sandwiched between the base 70 and the cover 80. The actuator 90 includes a driving rod with a male screw (not shown). The driving rod of the actuator 90 is rotated and the male screw drive the cover 80 on a curved side surface to move horizontally in a longitudinal direction F as shown in FIG. 1. The socket 6 not only increases the moving distance of the cover 80, but also avoids an upward movement of the cover 80. In addition, the cover 80 includes a pair of beams 81 extending downwardly from a bottom face thereof and a pair of hooks 82 extending inwardly from bottom ends of corresponding beams 81. The base 70 includes a pair of slits 71 for receiving corresponding beams 81 and a pair of shoulders 72 for engaging with corresponding hooks 82 to prevent the cover 80 from moving in a transverse direction f. However, the planar friction between the shoulders 72 and hooks 82 requires a large driving force. In design, a sufficient gap B between the beam 81 and the base 70 is provided so that the hooks 82 may be successfully inserted into the slits 71. Such allows the cover 80 to move along the transverse direction f. In order to overcome the above issue, a metal flake (not shown) is frequently inserted into the gap B between the beam 81 and the base 70; such increases the friction between cover 80 and the base 70. Therefore, a large driving force is required to move the cover 80 upon the base 70.

Hence, an improved socket is required to overcome the disadvantages of the conventional socket.

SUMMARY OF THE INVENTION

Accordingly, one object of the present invention is to provide a socket preventing a cover upon a base from moving transversely.

Another object of the present invention is to provide a socket with a guiding means having small friction between a base and a cover for convenience to manipulation.

In order to achieve the objects set forth, a socket in accordance with the present invention includes a base, a plurality of terminals received in the base, a cover movably mounted upon the base, an actuator and a guiding means. The actuator is sandwiched between the cover and the base for driving the cover upon the base to move. The guiding means includes a pair of columnar guiding posts extending downwardly from a bottom face of the cover and a pair of guiding holes defined in the base for receiving corresponding guiding posts. When the cover is in an open position, the guiding posts are loosely received in the guiding holes; and when the cover is in a close position, the guiding posts are closely received in the guiding holes.

Other objects, advantages and novel features of the invention will become more apparent from the following detailed description when taken in conjunction with the accompanying drawings.

DETAILED DESCRIPTION OF THE INVENTION

Reference will now be made to the drawing figures to describe the present invention in detail.

Figure 1:
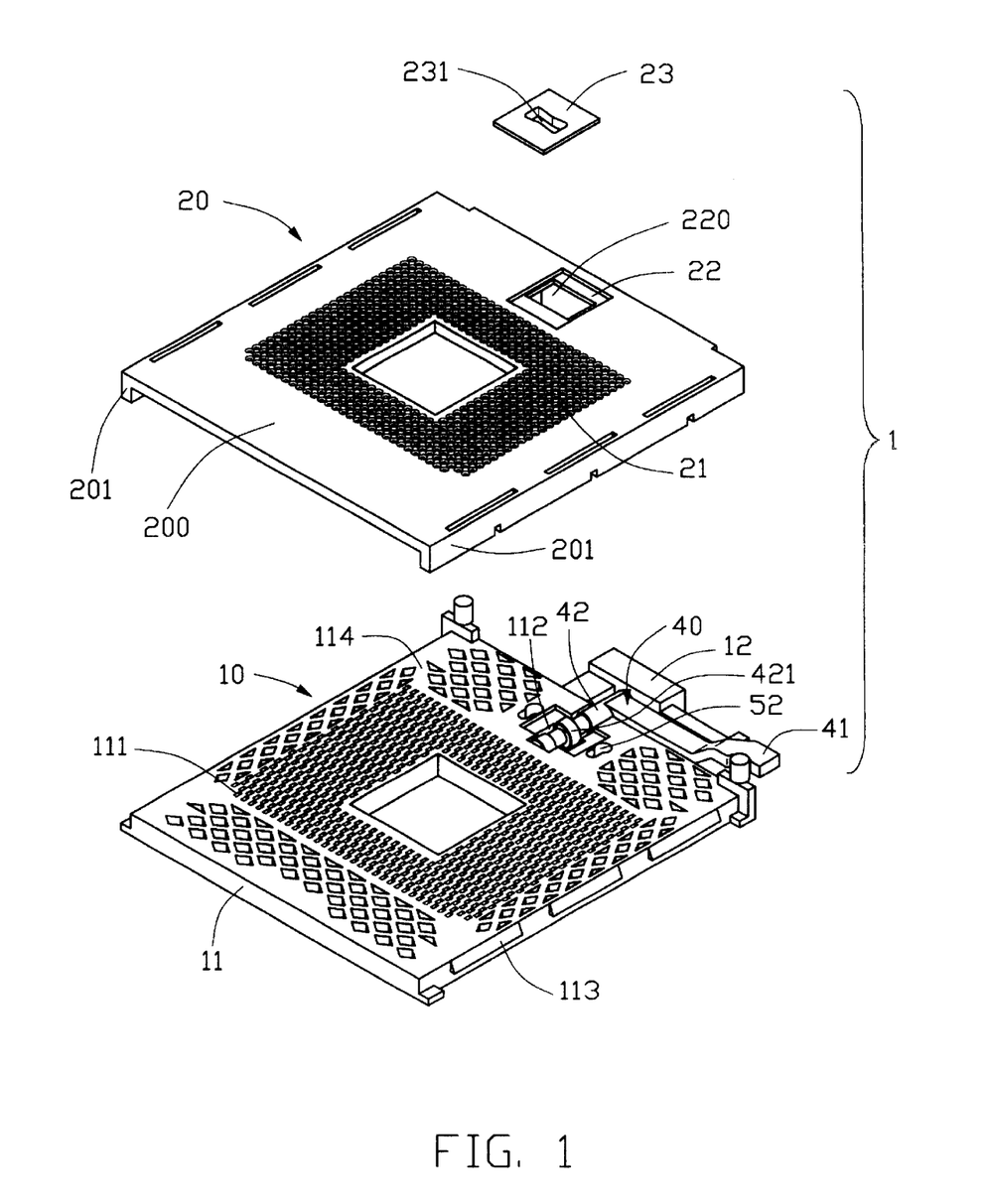
FIG. 1 is an exploded, perspective view of a CPU socket in accordance with a first embodiment of the present invention.
Figure 2:
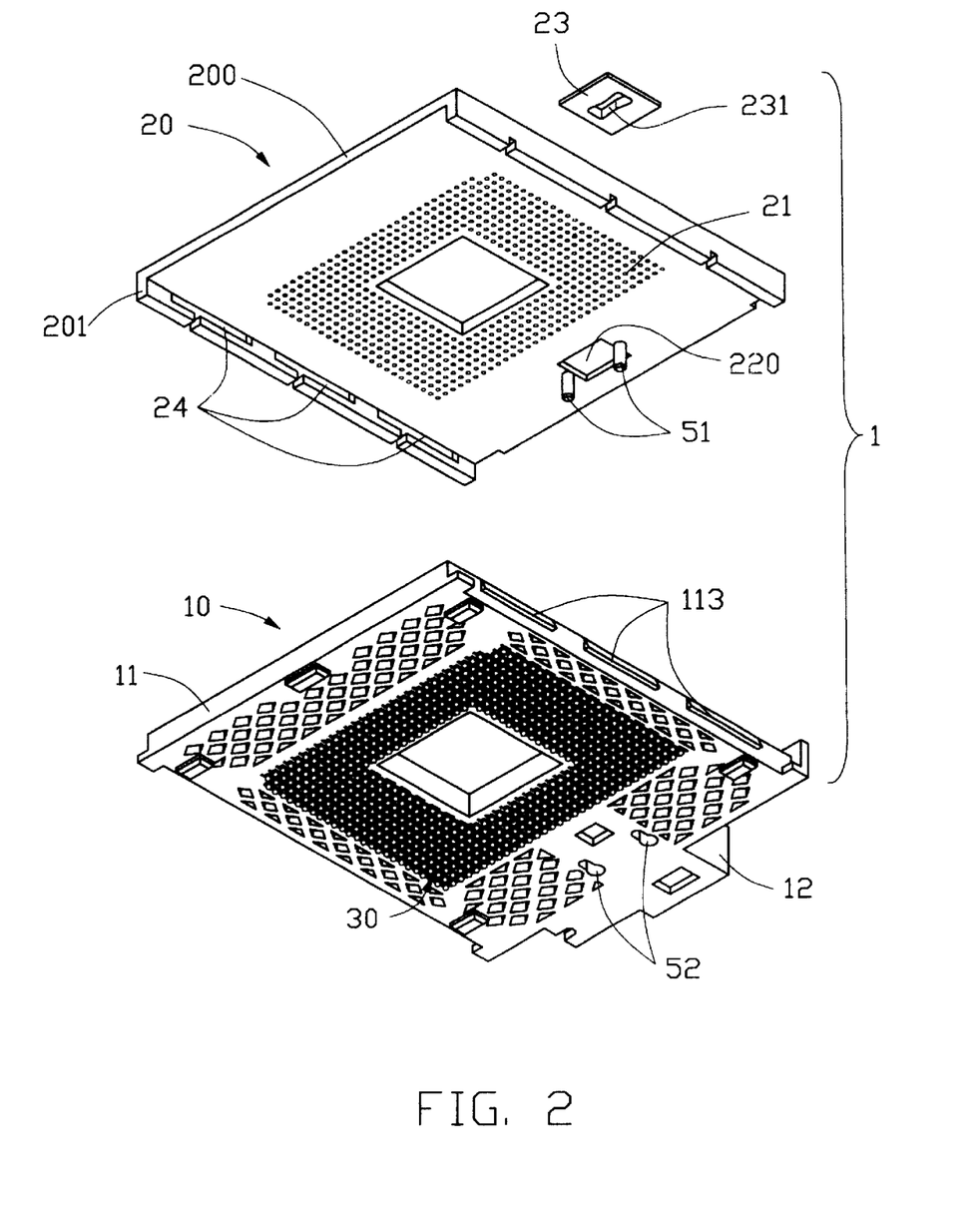
FIG. 2 is a view similar to FIG. 1 but showing the CPU socket from a bottom aspect.
Figure 3:
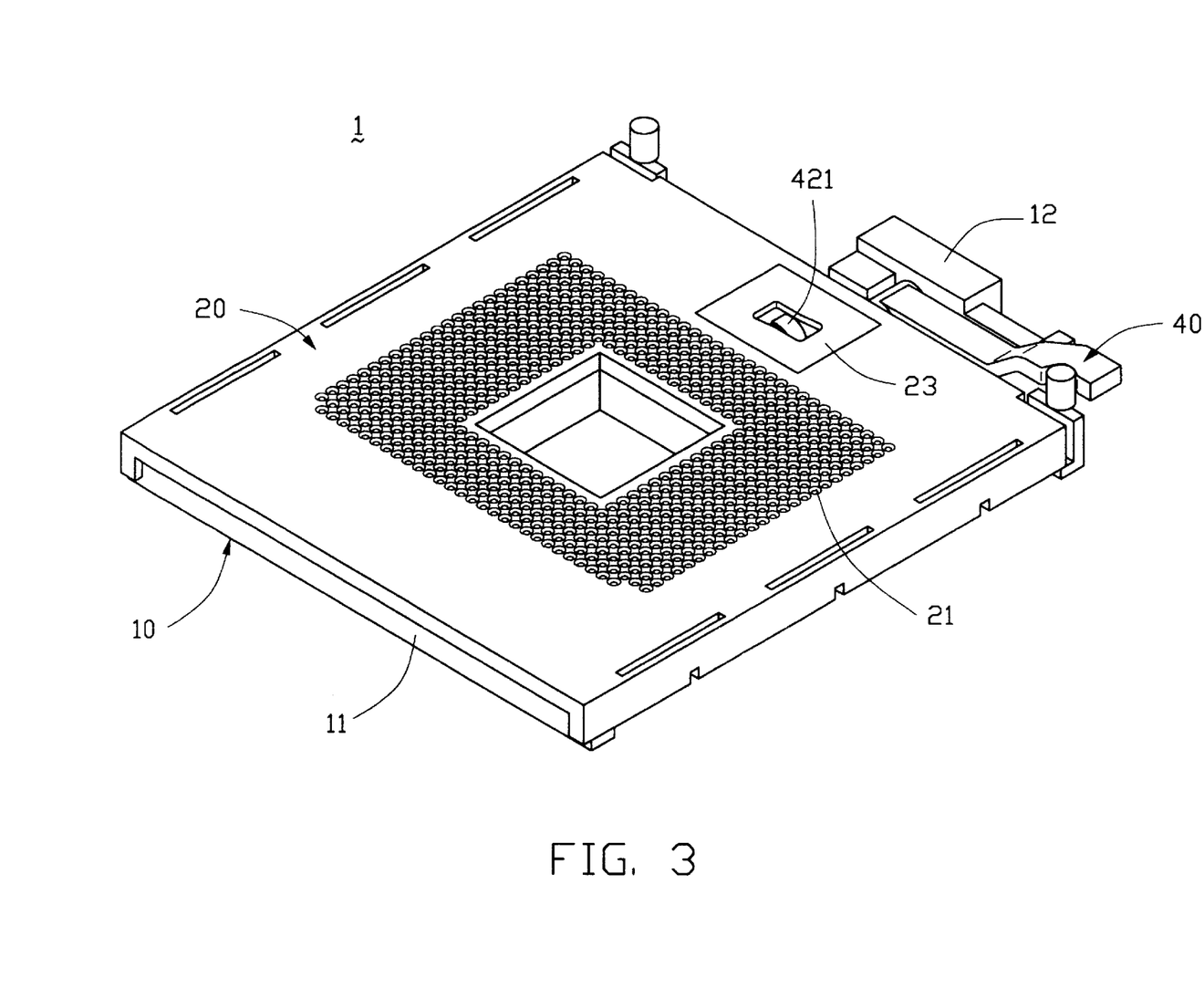
FIG. 3 is an assembled view of the CPU socket of FIG. 1.

Referring to FIGS. 1–3, a CPU socket 1 in accordance with a first embodiment of the present invention comprises a base 10, a cover 20 movably mounted upon the base 10, a plurality of terminals 30 received in the base 10, an actuator 40 sandwiched between the base 10 and the cover 20, a guiding means 50 (FIG. 4) and a metal plate 23 assembled to the cover 20.

The base 10 includes a rectangular member 11 and a projection 12 extending rearwardly from a rear end of the rectangular member 11. The rectangular member 11 defines a plurality of receiving cavities 111 for receiving corresponding terminals 30. The rectangular member 11 also forms a plurality of longitudinal wedges 113 at opposite transverse lateral sides thereof. A longitudinal receiving chamber 112 is defined in the rectangular member 11 and extends into the projection 12.

The cover 20 comprises a rectangular plate 200 mounted upon the rectangular member 11 of the base 10 and a pair of sidewalls 201 extending downwardly from opposite transverse lateral sides of the rectangular plate 20. The rectangular plate 200 defines a plurality of contact passageways 21 in alignment with corresponding receiving cavities 111 of the base 10 for receiving corresponding pins of a mating CPU (not shown) therein. The rectangular plate 200 also defines an aperture 22 for receiving the metal plate 23 and a rectangular hole 220 on a bottom wall of the cover 20. Each of the sidewalls 201 defines a plurality of longitudinal recesses 24 on an inward face thereof for movably receiving corresponding longitudinal wedges 113 of the base 10, thereby preventing an upward movement of the cover 20.

The actuator 40 includes a cam shaft 42 received in the longitudinal receiving chamber 112 and an integral operating handle 41 perpendicular to the cam shaft 42. The cam shaft 42 forms a screw 421 received in the rectangular hole 220 of the cover 20 and a receiving hole 231 of the metal plate 23. The screw 421 is rotated together with the operating handle 41 to engage with the metal plate 23 and drive the cover 20 upon the base 10 to move between an open position and a closed position.

Figure 4:
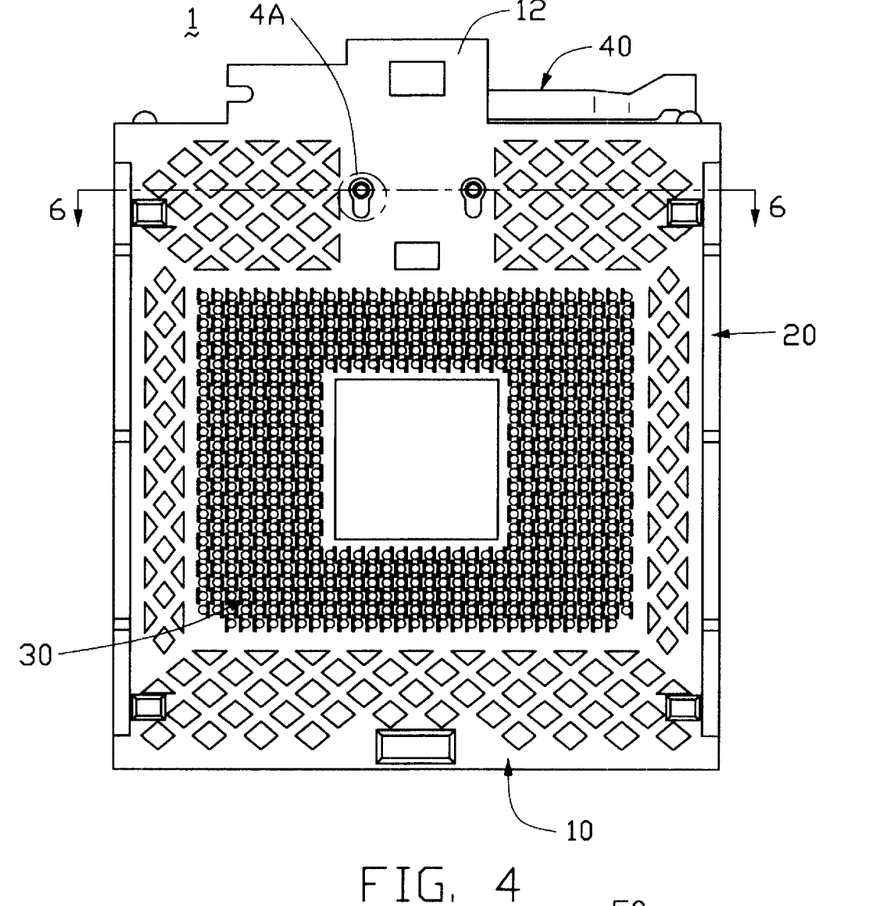
FIG. 4 is a bottom view of the CPU socket of FIG. 3 when a cover is in an open position.
Figure 4A:
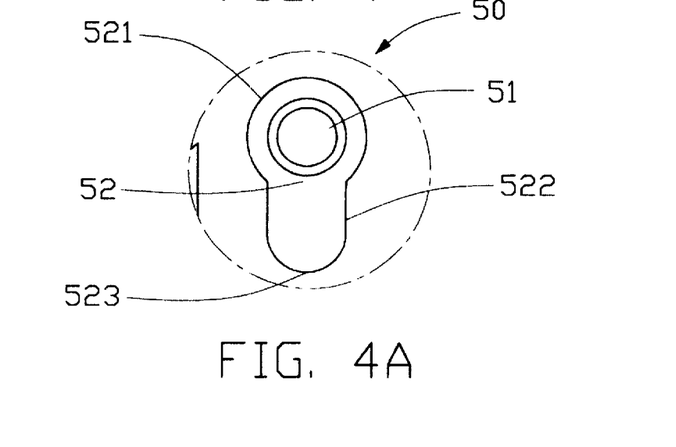
FIG. 4A is an enlarged view of a guiding means in FIG. 4.
Figure 5:
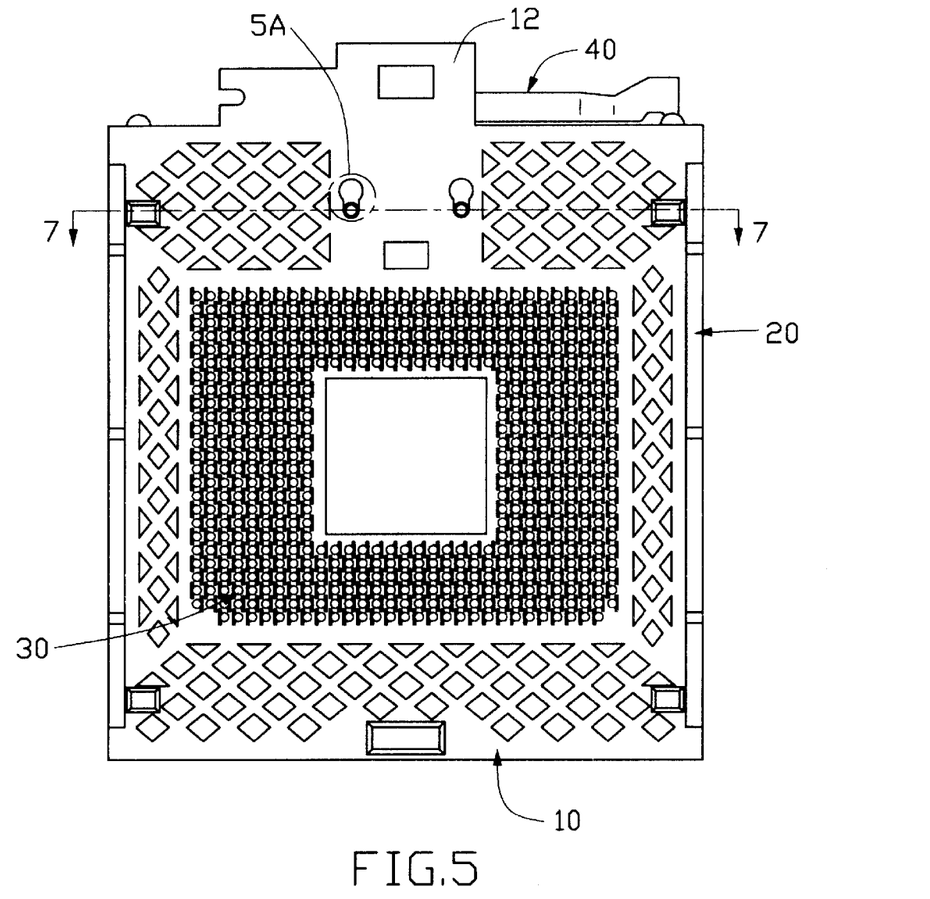
FIG. 5 is a bottom view of the CPU socket when the cover is in a closed position.
Figure 5A:
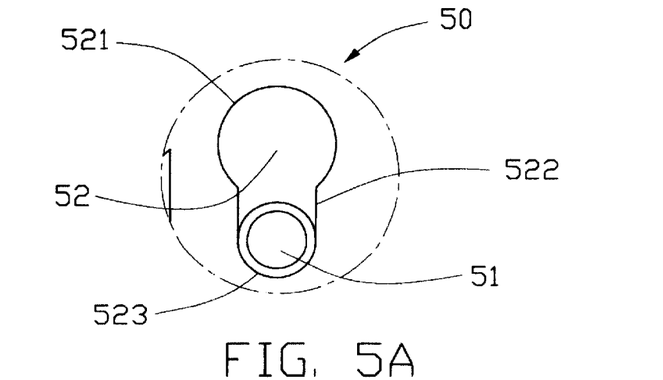
FIG. 5A is an enlarged view of the guiding means in FIG. 5.

Referring to FIGS. 4–5A in conjunction with FIGS. 1 and 2, the guiding means 50 comprises a pair of columnar guiding posts 51 extending downwardly from a bottom face of the cover 20 and a pair of opposite guiding grooves 52 defined in the base 10 for receiving corresponding guiding posts 51. The guiding groove 52 is surrounded by an arc rear wall 521 of an obtuse angle, an arc front wall 523 of a straight angle and a pair of parallel side walls 522 connecting with the rear wall 521 and the front wall 523. The rear wall 521, the side walls 522 and the front wall 523 together define the guiding groove 52. Furthermore, it should be noted that the diameter of the arc rear wall 521 is larger than that of the post 51 and the distance between the side walls 522 is substantially equal to the diameter of the post 51. Therefore, a larger space is defined by the arc rear wall 521 than a space defined by the sidewalls 522 and the front wall 523.

Figure 6:
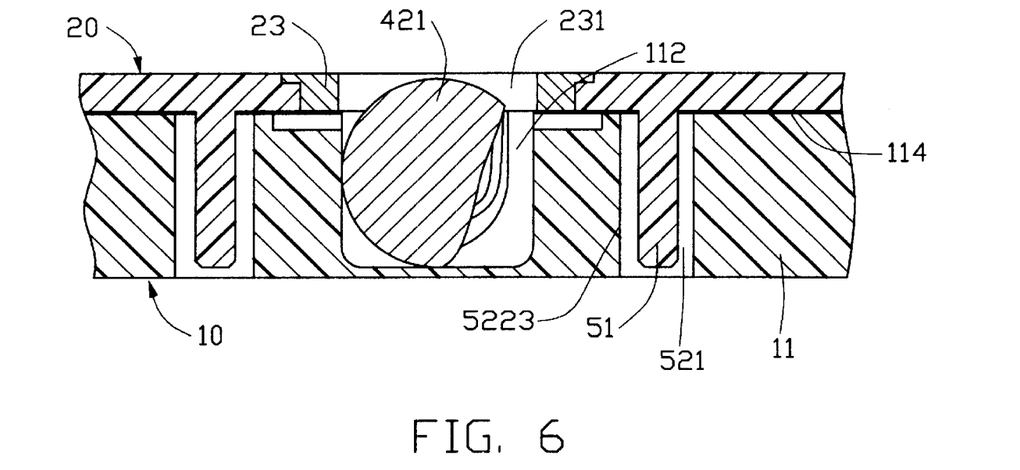
FIG. 6 is a partial, cross-sectional view of the CPU socket taken along line 6—6 of FIG. 4 when the cover is in the open position.
Figure 7:
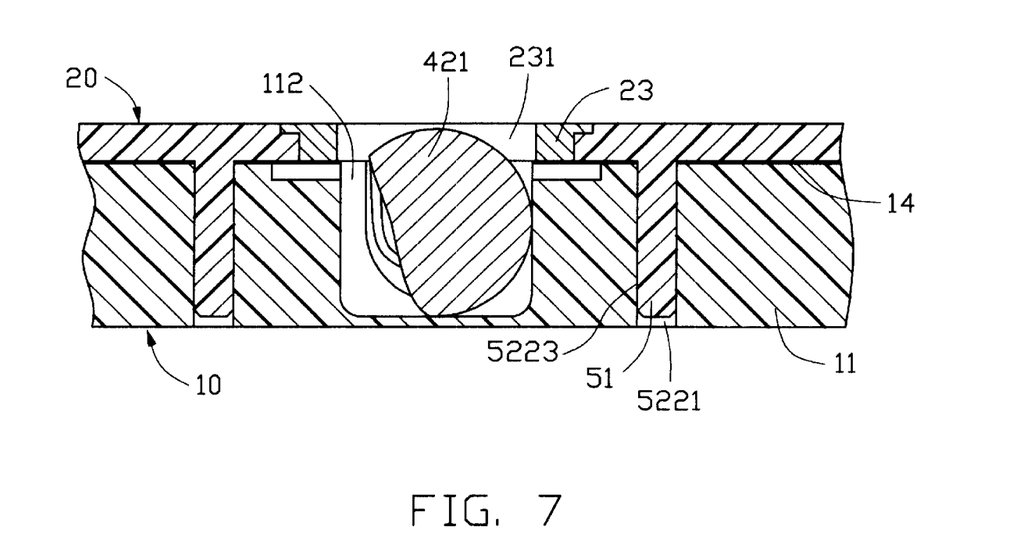
FIG. 7 is a partial, cross-sectional view of the CPU socket taken along line 7—7 of FIG. 5 when the cover is in the closed position.

Further, referring to FIGS. 6 and 7, when the cover 20 is in the open position, the guiding post 51 is loosely received in the guiding hole 52 close to the rear wall 521; and when the cover 20 is in the closed position, the guiding post 51 is closely received in guiding hole 52 close to the front wall 523. Thus, when the cover 20 is in the closed position, the guiding post 51 closely engages with side walls 522 so as to prevent the cover 20 from a transverse movement. In addition, the guiding post 51 has a columnar shape; such may reduce friction between the guiding post 51 and the sidewalls 5223 because there is a linear friction between the guiding post 51 and the sidewalls 522 in the present invention.

Figure 8:
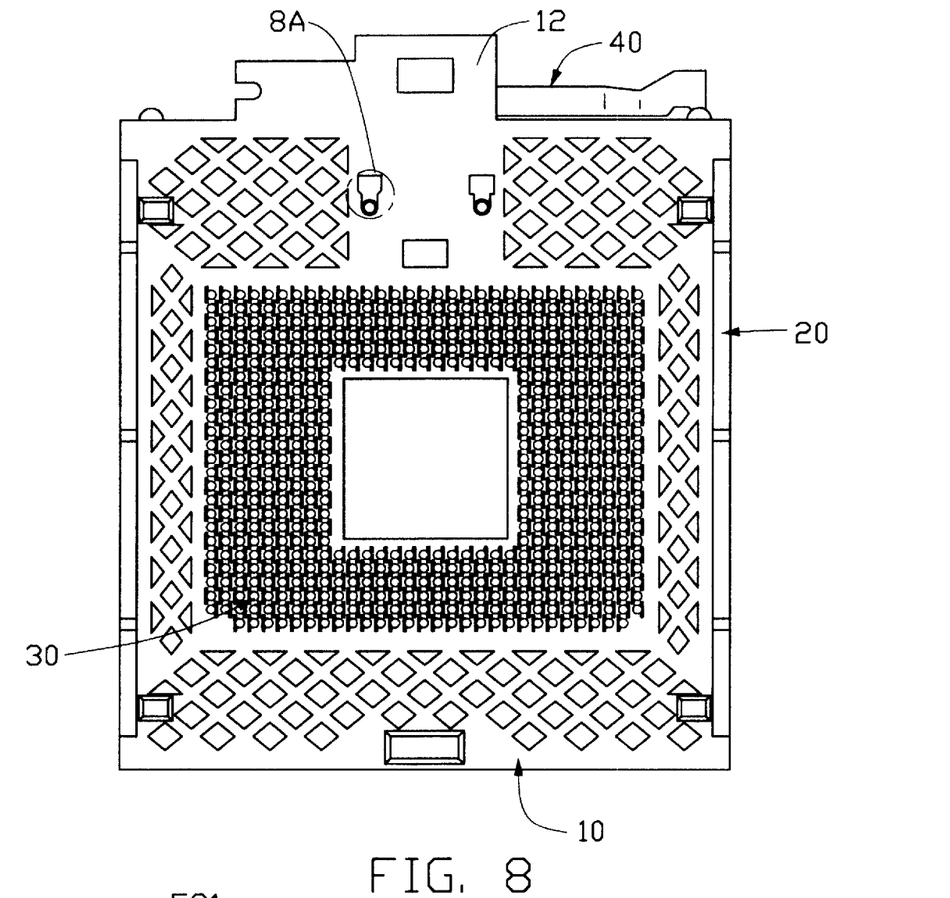
FIG. 8 is a bottom view of a CPU socket when a cover of a CPU socket is in a closed position in accordance with a second embodiment of the present invention.
Figure 8A:
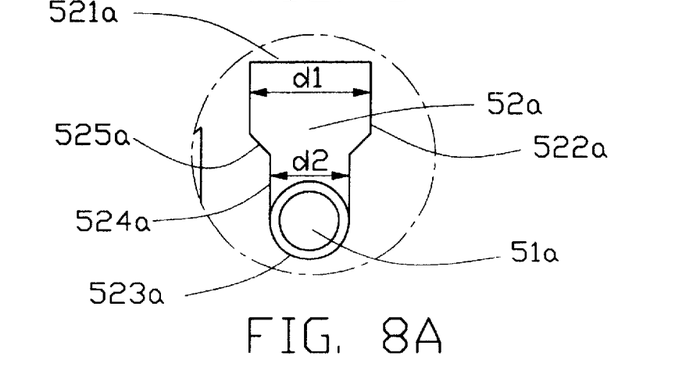
FIG. 8A is an enlarged view of a guiding means in FIG. 8.

FIGS. 8–8A illustrate a second embodiment of the present invention. In this embodiment, a guiding hole 52a is defined by a linear rear wall 521a, a pair of rear and front sidewalls 522a, 524a, a pair of middle walls 525a and an arc front wall 523a. The middle walls 525a connecting corresponding rear side walls 522a and corresponding front side walls 524a. It should be noted that the distance d1 between the rear side walls 522a is larger than the diameter of a guiding post 51a and the distance d2 between the front side walls 524a is substantially equal to the diameter of the post 521a. The other components are the same as the first embodiment described above; thus, a detailed description thereof is omitted here.

Figure 9:
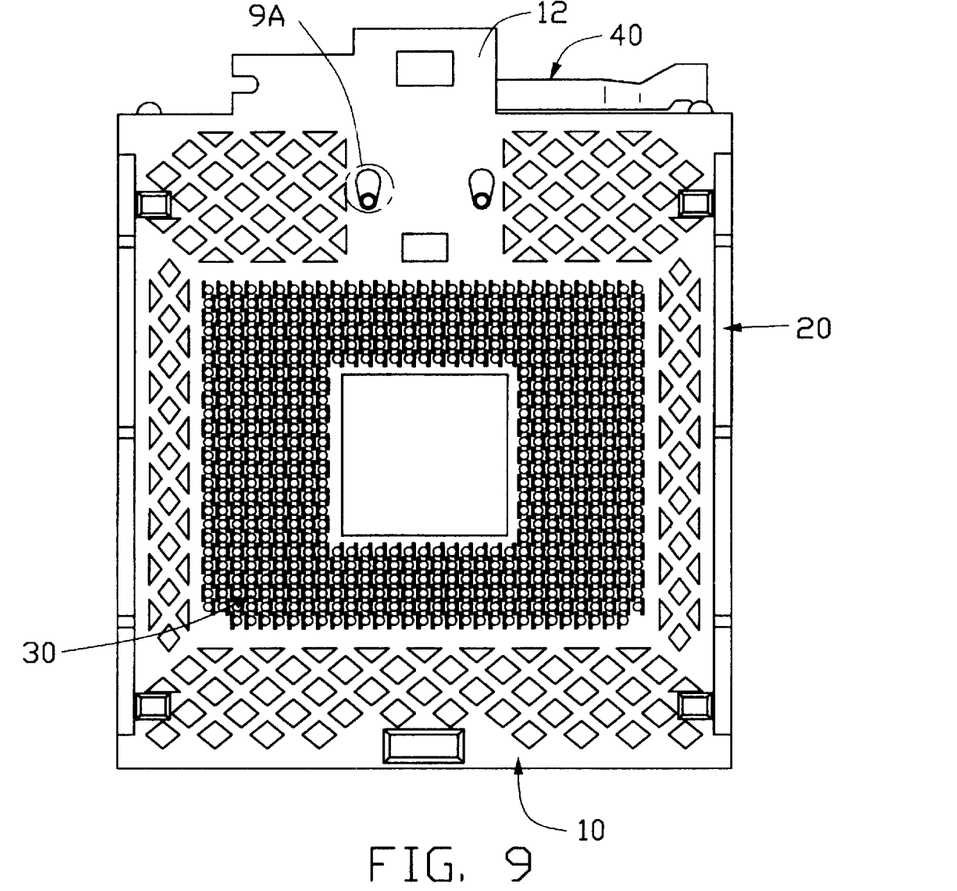
FIG. 9 is a view similar to FIG. 8 but showing a third embodiment of the present invention.
Figure 9A:
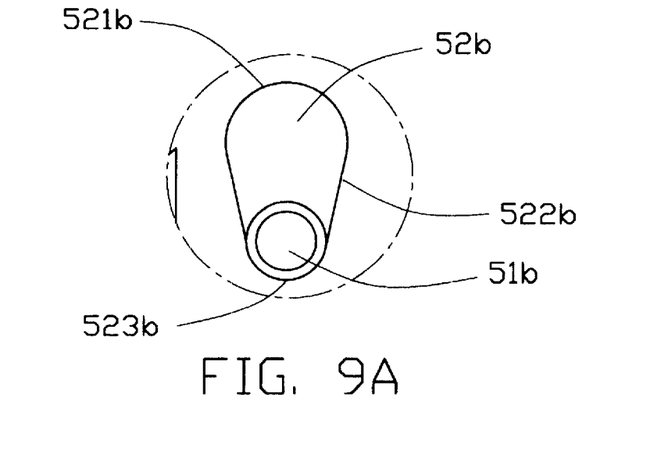
FIG. 9A is an enlarged view of a guiding means in FIG. 9.

FIGS. 9–9A illustrate a third embodiment of the present invention. In this embodiment, a guiding hole 52b is surrounded by an arc rear wall 521b of a sharp angle, an arc front wall 523b of an sharp angle and a pair of side walls 522b at a common tangent to the arc rear wall 521b and the arc front wall 523b. It should be noted that the diameter of the rear wall 521b is larger than that of a post 51b and the diameter of the arc front wall 523b is substantially equal to that of the post 51b. The other components are the same as the first embodiment described above; thus, a detailed description thereof is omitted here.

Figure 10:
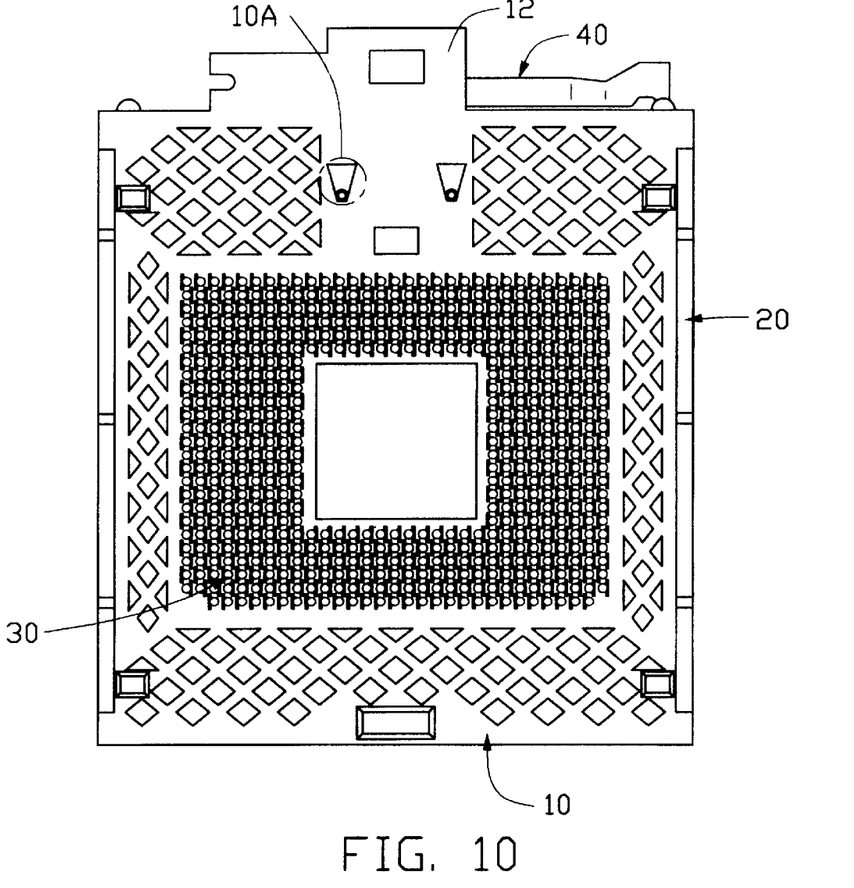
FIG. 10 is a view similar to FIG. 8 but showing a forth embodiment of the present invention.
Figure 10A:
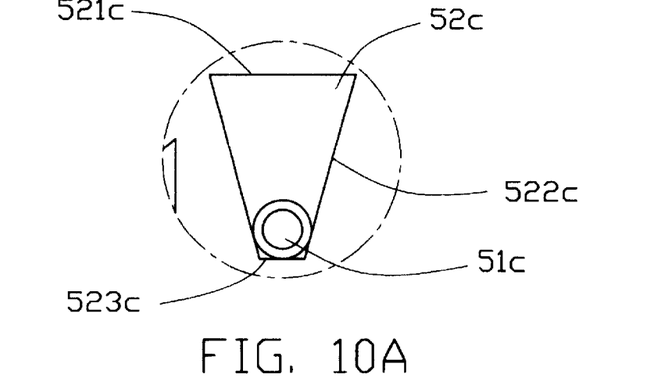
FIG. 10A is an enlarged view of a guiding means of FIG. 10.

FIGS. 10–10A illustrate a forth embodiment of the present invention. In this embodiment, a guiding hole 52c has a trapezoid shape and is surrounded by a linear rear wall 521c, a linear front wall 523c and a pair of opposite linear side walls 522c connecting with the rear wall 521c and the front wall 523c. It should be noted that the length of the rear wall 521c is larger than the diameter of a guiding post 51c and the length of the front wall 523c is substantially equal to the diameter of the guiding post51c. The other components are the same as the first embodiment described above; thus, a detailed description thereof is omitted here.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket, comprising:

a base defining a plurality of receiving cavities;

a plurality of terminals received in corresponding receiving cavities;

a cover movably mounted upon the base and between an open position and a closed position; and a guiding means comprising a post extending downwardly from the cover and a guiding hole defined in the base for receiving the post, the guiding hole including a larger space and a smaller space communicating with the larger space; wherein when the cover is in the open position, the post is freely received in the larger space, and when the cover moves from the open position to the closed position, the post moves accordingly from the larger space to the smaller space and closely engaging with peripheral walls of the smaller space.

2. The socket as described in claim 1, further comprising an actuator for driving the cover upon the base to move.

3. The socket as described in claim 2, wherein the base defines a longitudinal receiving slot for receiving the actuator.

4. The socket as described in claim 2, further comprising a metal plate assembled to the cover and engaging with the actuator for driving the cover upon the base to move.

5. The socket as described in claim 1, wherein the guiding hole is surrounded by a wide rear wall, a narrow front wall and a pair of side walls.

6. The socket as described in claim 5, wherein the guiding post has a columnar shape and linearly engages with the side walls.

7. The socket as described in claim 5, wherein the rear wall has an arc shape of an obtuse angle, the front wall has an arc shape of a sharp angle and the side walls is parallel to each other.

8. The socket as described in claim 5, wherein the rear wall has an linear shape, the front wall has an arc shape of a sharp angle and the side walls comprise a pair of parallel rear side walls and a pair of parallel front side walls, a middle wall is provided for connecting with the rear sidewalls and front side walls.

9. The socket as described in claim 5, wherein the rear wall has an arc shape of an obtuse angle, the front wall has an arc shape of a sharp angle and the side walls is at common tangent to the rear wall and the front wall.

10. The socket as described in claim 1, wherein guiding hole has a trapezoid shape.

* * * * *